United States Patent
Xiao et al.

(10) Patent No.: US 12,000,792 B2
(45) Date of Patent: Jun. 4, 2024

(54) CMOS-MEMS HUMIDITY SENSOR

(71) Applicants: HANGZHOU WEIMING XINKE TECHNOLOGY CO., LTD, Zhejiang (CN); ADVANCED INSTITUTE OF INFORMATION TECHNOLOGY (AIIT), PEKING UNIVERSITY, Zhejiang (CN)

(72) Inventors: Han Xiao, Zhejiang (CN); Guangjun Yu, Zhejiang (CN); Le Ye, Zhejiang (CN); Ru Huang, Zhejiang (CN)

(73) Assignees: HANGZHOU WEIMING XINKE TECHNOLOGY CO., LTD, Zhejiang (CN); ADVANCED INSTITUTE OF INFORMATION TECHNOLOGY, PEKING UNIVERSITY, Zhejiang (CN)

( * ) Notice: Subject to any disclaimer, the term of this patent is extended or adjusted under 35 U.S.C. 154(b) by 204 days.

(21) Appl. No.: 17/621,977

(22) PCT Filed: Jun. 30, 2020

(86) PCT No.: PCT/CN2020/099378
§ 371 (c)(1),
(2) Date: Dec. 22, 2021

(87) PCT Pub. No.: WO2021/000866
PCT Pub. Date: Jan. 7, 2021

(65) Prior Publication Data
US 2022/0244207 A1    Aug. 4, 2022

(30) Foreign Application Priority Data
Jul. 2, 2019 (CN) .......................... 201910591523.0

(51) Int. Cl.
*G01N 27/22* (2006.01)
*B81B 7/00* (2006.01)

(52) U.S. Cl.
CPC ......... *G01N 27/223* (2013.01); *B81B 7/0096* (2013.01); *B81B 2201/0214* (2013.01);
(Continued)

(58) Field of Classification Search
None
See application file for complete search history.

(56) References Cited

U.S. PATENT DOCUMENTS

2003/0002238 A1    1/2003  Toyoda
2014/0125359 A1*   5/2014  El-Gamal ................. G01L 9/12
                                                    324/664
(Continued)

FOREIGN PATENT DOCUMENTS

CN    1455251 A      11/2003
CN    101620197 A    1/2010
(Continued)

*Primary Examiner* — Incent Q Nguyen
(74) *Attorney, Agent, or Firm* — Muncy, Geissler, Olds & Lowe, P.C.

(57) ABSTRACT

A CMOS-MEMS humidity sensor includes a complementary metal oxide semiconductor (CMOS) ASIC readout circuit and a microelectromechanical system (MEMS) humidity sensor. The MEMS humidity sensor is provided on the ASIC readout circuit. The ASIC readout circuit includes a substrate, a heating resistor layer located above the substrate, a metal layer located above the heating resistor layer, and dielectric layers. The substrate, the heating resistor layer, and the metal layer are partitioned by dielectric layers. The MEMS humidity sensor includes an aluminum electrode layer, a passivation layer located above the aluminum electrode layer, and a humidity sensitive layer located above the passivation layer. The provision of heating resistors in the ASIC circuit realizes the heating function and satisfies (Continued)

the requirements of the standard CMOS process, so that the CMOS-MEMS integrated humidity sensor can be used stably under low temperature and high humidity conditions.

9 Claims, 5 Drawing Sheets

(52) U.S. Cl.
CPC ... *B81B 2203/0136* (2013.01); *B81B 2203/04* (2013.01); *B81B 2207/015* (2013.01)

(56) References Cited

U.S. PATENT DOCUMENTS

| | | | |
|---|---|---|---|
| 2017/0082567 A1* | 3/2017 | O'Brien | G01N 27/223 |
| 2020/0018716 A1* | 1/2020 | Mitani | G01N 27/226 |

FOREIGN PATENT DOCUMENTS

| | | | |
|---|---|---|---|
| CN | 102243199 | A | 11/2011 |
| CN | 102253091 | A | 11/2011 |
| CN | 103236429 | A | 8/2013 |
| CN | 103303859 | A | 9/2013 |
| CN | 103675042 | A | 3/2014 |
| CN | 103698367 | A | 4/2014 |
| CN | 104914138 | A | 9/2015 |
| CN | 105253851 | A | 1/2016 |
| CN | 107121461 | A | 9/2017 |
| CN | 107144609 | A | 9/2017 |
| CN | 104849325 | B | 2/2018 |
| CN | 109444235 | A | 3/2019 |
| CN | 110346423 | A | 10/2019 |
| WO | WO-2014108371 | A1 | 7/2014 |

\* cited by examiner

Top View, comb-like TM (top layer metal) Structure 1

Top View, comb-like TM (top layer metal) Structure2

CMOS-MEMS HUMIDITY SENSOR

TECHNICAL FIELD

The present application relates to the field of semiconductor chips, in particular to a CMOS-MEMS humidity sensor.

BACKGROUND

In fields such as aeronautics and astronautics, smart home, cold chain logistics, clean workshops, agriculture and animal husbandry, it is necessary to detect or monitor changes in environmental humidity to maintain the humidity in an appropriate state. Humidity detection principles mainly include resistive type, piezoresistive type and capacitive type, in which capacitive sensors are widely used due to their simple structure, wide detection range, high reliability, and easy integration with CMOS technology.

Currently, there are two main design methods for capacitive sensors. One design is a flat-plate structure design, in which a humidity sensitive layer is placed in an interlayer between a first electrode plate and a second electrode plate, and the second electrode plate has several holes provided thereon to allow air to enter a polymer sensitive layer, thereby realizing humidity perception. Such a solution is generally only suitable for fabricating discrete devices, which need to be sealed together in cooperation with an Application specific integrated circuit (ASIC) chip system in a package (SiP) before use, and it is impossible to realize the integration of ASIC and MEMS devices on a single chip. The other design is a comb-like capacitive structure design, in which a first electrode and a second electrode are in the same plane, and a polymer layer is placed between the first electrode and the second electrode to realize humidity measurement by means of side capacitance detection. The advantage of this solution is that ASIC and MEMS devices can be integrated on a single chip, which has a greater advantage in terms of cost.

On the other hand, under severe working environment such as low temperature and high humidity, condensed water will be produced in the sensitive layer of the humidity sensor, which will affect a normal operation of the sensor; therefore, in the prior art, there is a solution in which a heating resistor is arranged under the comb-like layer of the MEMS humidity device, so as to solve the problem of condensate water; at the same time, different heating strategies are implemented, which can also improve a response performance of the device. However, this solution cannot achieve the integration of CMOS-MEMS, mainly because the post-aluminum process cannot be compatible with a suitable heating resistor fabrication solution.

In summary, it is necessary to provide a CMOS-MEMS humidity sensor that can realize CMOS-MEMS integration and has a heating function.

SUMMARY

In order to solve the above problems, the present application proposes a CMOS-MEMS humidity sensor, which includes: a complementary metal oxide semiconductor ASIC readout circuit and a micro-electro-mechanical system (MEMS) humidity sensor, the MEMS humidity sensor being arranged on the ASIC readout circuit;

the ASIC readout circuit includes: a substrate, a heating resistor layer, metal layers, and a dielectric layer, in which the heating resistor layer is located above the substrate, the metal layers are located above the heating resistor layer, and the substrate, the heating resistor layer and the metal layers are separated by the dielectric layer; and the MEMS humidity sensor includes an aluminum electrode layer, a passivation layer and a humidity sensitive layer, in which the passivation layer is located above the aluminum electrode layer, and the humidity sensitive layer is located above the passivation layer.

Preferably, the heating resistor layer includes a plurality of heating resistors connected in parallel or in series.

Preferably, the heating resistors are doped with polysilicon or N-well doped or P-well doped.

Preferably, the number of the metal layers is determined according to the ASIC circuit, the metal layers are separated from each other by the dielectric layer, and among the metal layers, the metal layer closest to the aluminum electrode layer is a sub-top layer metal.

Preferably, the aluminum electrode layer is located above a sub-top layer metal and distributed in an comb-like array, and the aluminum electrode layer is a top layer metal.

Preferably, the passivation layer is located above a top layer metal and a sub-top layer metal, and includes silicon oxide, silicon nitride or a composite thereof, and a thickness of the passivation layer is 80 nm to 150 nm.

Preferably, the humidity sensitive layer includes: polyimide, aluminum nitride or graphene.

Preferably, the ASIC readout circuit is manufactured using a standard CMOS process with one layer of polycrystalline and multiple layers of metal.

Preferably, the substrate is a silicon substrate.

The present application has the following advantages: the heating resistors are arranged in the ASIC circuit to realize a heating function and meet the CMOS standard process, so that the CMOS-MEMS integrated humidity sensor can be used stably under low temperature and high humidity working conditions.

BRIEF DESCRIPTION OF THE DRAWINGS

Upon reading the detailed description of preferred embodiments below, various other advantages and benefits will become clear to those skilled in the art. The drawings are only used for the purpose of illustrating the preferred embodiments, and should not be considered as a limitation to the present application. Moreover, throughout the drawings, identical components are denoted by identical reference signs. In the drawings.

DETAILED DESCRIPTION

Figure 1:
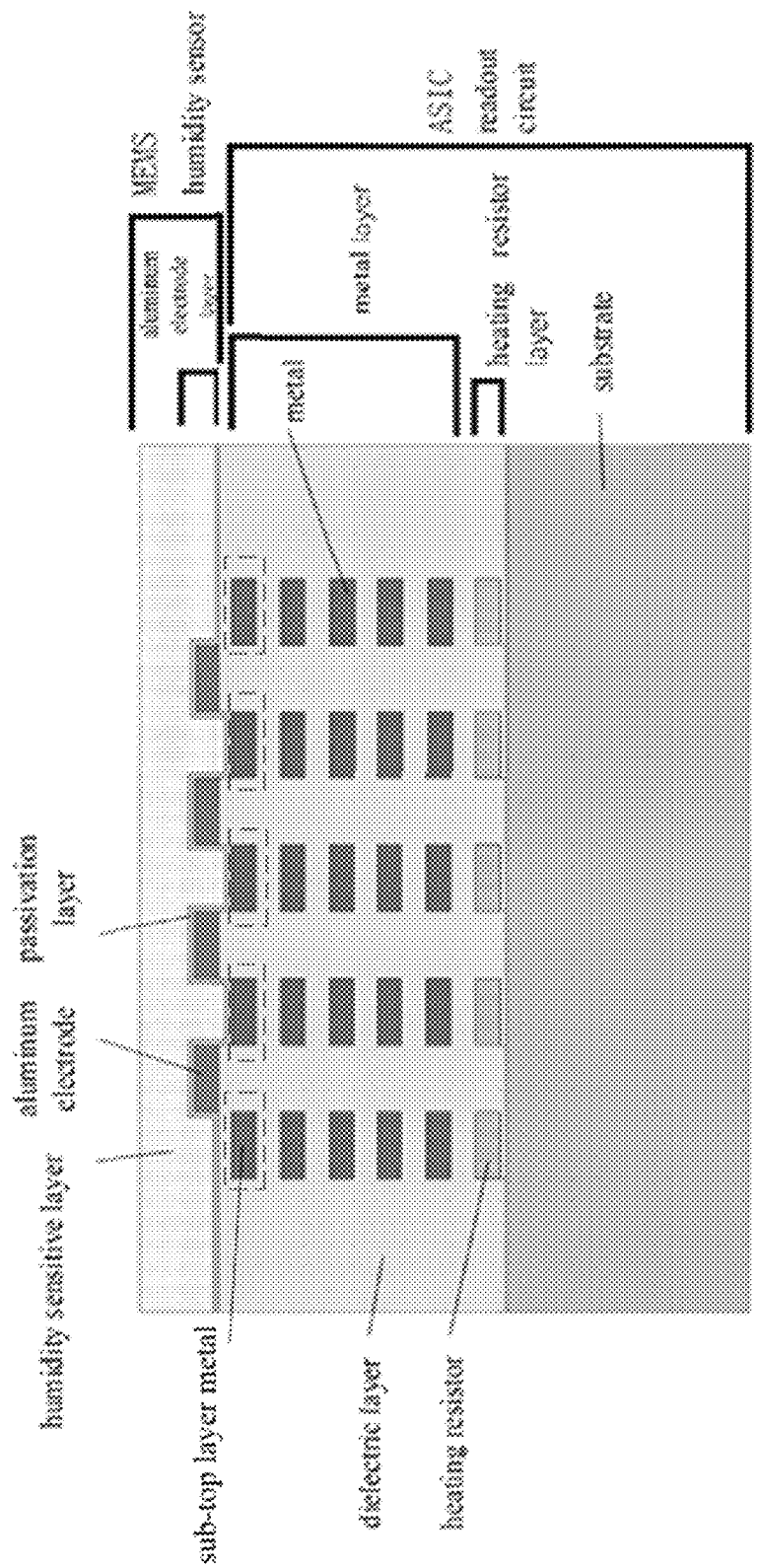
FIG. 1 shows a structural diagram of a CMOS-MEMS humidity sensor provided by the present application.

Hereinafter, exemplary embodiments of the present disclosure will be described in more detail with reference to the accompanying drawings. Although the exemplary embodiments of the present disclosure are shown in the drawings, it should be understood that the present disclosure may be implemented in various forms and should not be limited by the embodiments set forth herein. On the contrary, these embodiments are provided to enable a more thorough understanding of the present disclosure and to fully convey the scope of the present disclosure to those skilled in the art.

According to an embodiment of the present application, a CMOS-MEMS humidity sensor is proposed; as shown in the sole FIGURE, the CMOS-MEMS humidity sensor includes: a complementary metal oxide semiconductor ASIC readout circuit and a microelectromechanical system (MEMS) humidity sensor, the MEMS humidity sensor being arranged on the ASIC readout circuit;

the ASIC readout circuit includes: a substrate, a heating resistor layer, metal layers, and a dielectric layer, in which the heating resistor layer is located above the substrate, the metal layers are located above the heating resistor layer, and the substrate, the heating resistor layer and the metal layers are separated by the dielectric layer; and the MEMS humidity sensor includes an aluminum electrode layer, a passivation layer and a humidity sensitive layer, in which the passivation layer is located above the aluminum electrode layer, and the humidity sensitive layer is located above the passivation layer.

Figure 2:
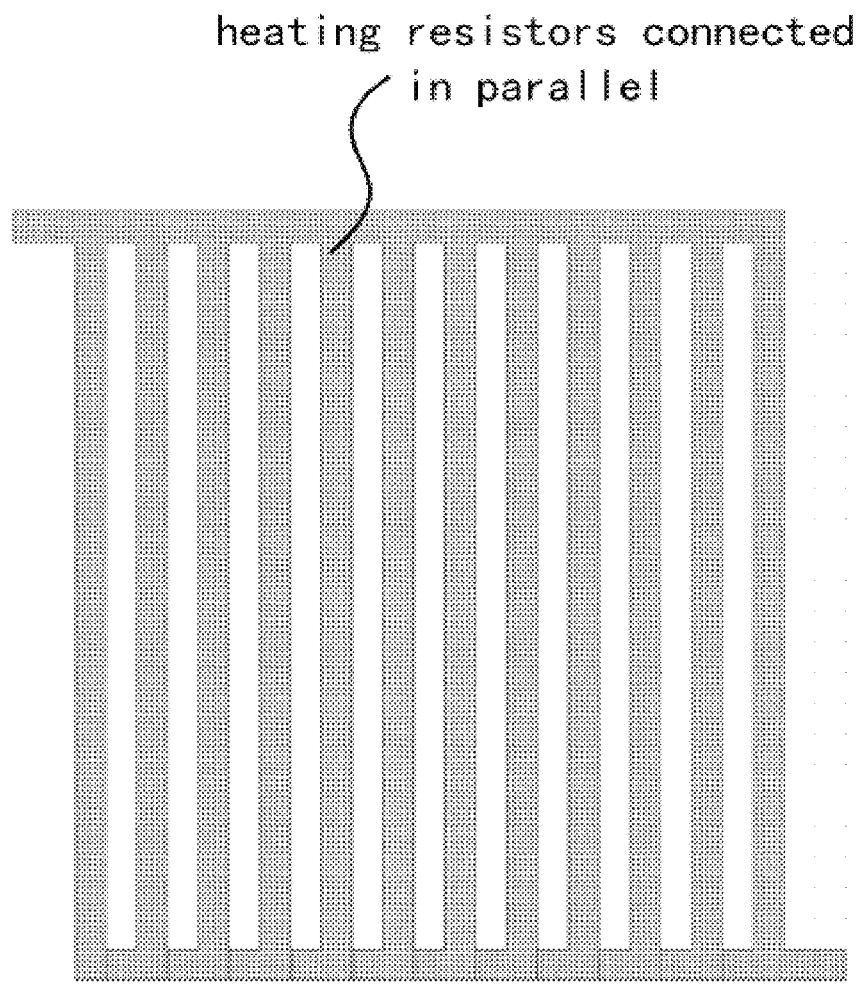
FIG. 2 shows the heating resistors connected in parallel.
Figure 3:
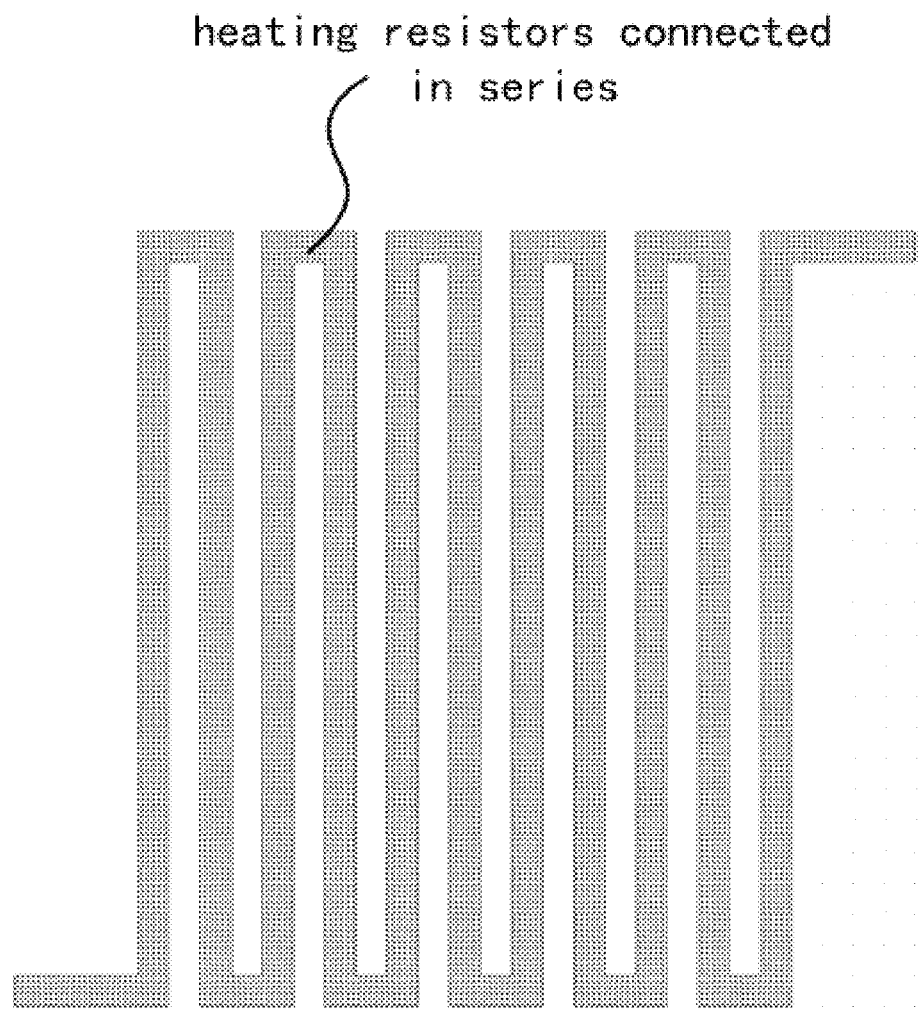
FIG. 3 shows the heating resistors connected in series.

The heating resistor layer includes a plurality of heating resistors connected in parallel or in series, as shown in FIG. 2 and FIG. 3, respectively.

The heating resistors are doped with polycrystalline or N-well doped or P-well doped.

The number of the metal layers is determined according to the ASIC circuit, the metal layers are separated from each other by the dielectric layer, and among the metal layers, the metal layer closest to the aluminum electrode layer is a sub-top layer metal.

The metal layers are arranged on a resistor strip (heating resistors).

In a possible embodiment, the metal layers may be aluminum.

Figure 4:
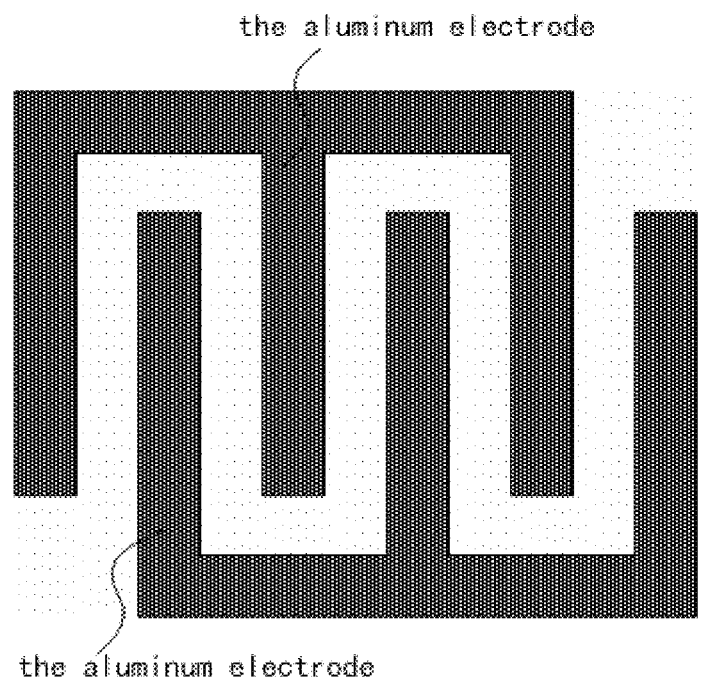
FIG. 4 shows that the aluminum electrode layers are distributed in a comb-like array.
Figure 5:
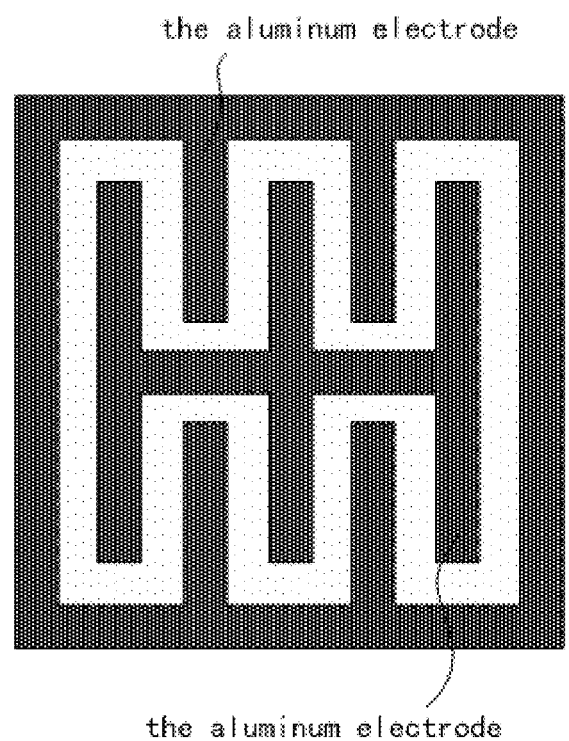
FIG. 5 shows that the aluminum electrode layers are distributed in a comb-like array.

The aluminum electrode layer is located above a sub-top layer metal and distributed in an comb-like array, as shown in FIGS. 4 and 5, and the aluminum electrode layer is a top layer metal.

The passivation layer is located above a top layer metal and a sub-top layer metal, and includes silicon oxide, silicon nitride or a composite thereof, etc., and a thickness of the passivation layer is 80 nm to 150 nm.

The humidity sensitive layer includes: polyimide, aluminum nitride or graphene, etc.

The ASIC readout circuit is manufactured using a standard CMOS process with one layer of polycrystalline and multiple layers of metal.

The substrate is a silicon substrate.

In order to better understand the embodiments of the present application, the structure of the present application will be described below.

As shown in the sole FIGURE, the CMOS-MEMS humidity sensor includes an ASIC readout circuit and a humidity sensor layer. The ASIC readout circuit layer includes a substrate, a heating resistor layer, a dielectric layer, and metal layers. The MEMS humidity sensor layer includes an aluminum electrode layer (comb-like electrodes), a passivation layer and a humidity sensitive layer.

The dielectric layer is arranged on the substrate, the heating resistor layer is arranged on the dielectric layer, and the dielectric layer and the metal layers are arranged in sequence until the processing of the CMOS readout circuit is completed. The CMOS readout circuit has the dielectric layer on the surface. The comb-like electrodes of the humidity sensor are arranged on the CMOS readout circuit. The passivation layer is arranged on the comb-like electrode layer. Before the passivation layer is applied, the dielectric layer between the comb-like electrodes is removed until a sub-top layer metal is exposed. Finally, the humidity sensitive layer is arranged on the passivation layer.

The aluminum electrode layer includes a plurality of aluminum electrodes (comb-like electrodes).

The metal layers include a plurality of metals.

In the embodiment of the present application, the heating resistors are arranged in the ASIC circuit to realize a heating function and meet the CMOS standard process, so that the CMOS-MEMS integrated humidity sensor can be used stably under low temperature and high humidity working conditions.

Described above are only preferred specific embodiments of the present application, but the scope of protection of the present application is not limited thereto. Any change or replacement that can be easily conceived by those skilled in the art within the technical scope disclosed in the present application shall be covered within the scope of protection of the present application. Therefore, the scope of protection of the present application shall be subject to the scope of protection of the claims.

The invention claimed is:

1. A CMOS-MEMS humidity sensor, comprising: a complementary metal oxide semiconductor ASIC readout circuit and a microelectromechanical system (MEMS) humidity sensor, the MEMS humidity sensor being arranged on the ASIC readout circuit;

wherein the ASIC readout circuit comprises a substrate, a heating resistor layer, metal layers, and a dielectric layer, the heating resistor layer is located above the substrate, the metal layers are located above the heating resistor layer, and the substrate, the heating resistor layer and the metal layers are separated by the dielectric layer; and the MEMS humidity sensor comprises an aluminum electrode layer, a passivation layer and a humidity sensitive layer, the aluminum electrode layer comprises a plurality of aluminum electrodes, wherein portions of the passivation layer is located above the plurality of aluminum electrodes in the aluminum electrode layer, and the humidity sensitive layer is located above the passivation layer.

2. The sensor according to claim 1, wherein the heating resistor layer comprises a plurality of heating resistors connected in parallel or in series.

3. The sensor according to claim 2, wherein the heating resistors are doped with polycrystalline or N-well doped or P-well doped.

4. The sensor according to claim 1, wherein the number of the metal layers is determined according to the ASIC circuit, the metal layers are separated from each other by the dielectric layer, and among the metal layers, the metal layer closest to the aluminum electrode layer is a sub-top layer metal.

5. The sensor according to claim 1, wherein the aluminum electrode layer is located above a sub-top layer metal and distributed in a comb-like array, and the aluminum electrode layer is a top layer metal.

6. The sensor according to claim 1, wherein the passivation layer is located above a top layer metal and a sub-top layer metal, and comprises silicon oxide, silicon nitride or a composite thereof, and a thickness of the passivation layer is 80 nm to 150 nm.

7. The sensor according to claim 1, wherein the humidity sensitive layer comprises: polyimide, aluminum nitride or graphene.

8. The sensor according to claim 1, wherein the ASIC readout circuit is manufactured using a standard CMOS process with one layer of polycrystalline and multiple layers of metal.

9. The sensor according to claim 1, wherein the substrate is a silicon substrate.

\* \* \* \* \*